US006593239B2

(12) United States Patent
Kaufman et al.

(10) Patent No.: US 6,593,239 B2
(45) Date of Patent: *Jul. 15, 2003

(54) CHEMICAL MECHANICAL POLISHING METHOD USEFUL FOR COPPER SUBSTRATES

(75) Inventors: Vlasta Brusic Kaufman, Geneva, IL (US); Rodney C. Kistler, St. Charles, IL (US)

(73) Assignee: Cabot Microelectronics Corp., Aurora, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/366,588

(22) Filed: Aug. 4, 1999

(65) Prior Publication Data

US 2002/0033382 A1 Mar. 21, 2002

Related U.S. Application Data

(62) Division of application No. 08/763,705, filed on Dec. 9, 1996, now Pat. No. 5,954,997.

(51) Int. Cl.[7] .............................................. H01L 21/302
(52) U.S. Cl. ..................... 438/692; 438/693; 438/694; 438/700; 438/749; 438/754; 438/756; 438/652; 438/653; 438/687; 216/88; 216/89
(58) Field of Search ................................. 438/692, 693, 438/694, 700, 749, 754, 756, 652, 653, 687; 216/88, 89

(56) References Cited

U.S. PATENT DOCUMENTS

| 3,385,682 A | | 5/1968 | Lowen |
| 3,668,131 A | | 6/1972 | Banush et al. |
| 4,086,176 A | * | 4/1978 | Ericson et al. .............. 252/100 |
| 4,671,851 A | | 6/1987 | Beyer et al. |
| 4,789,648 A | | 12/1988 | Chow et al. |

(List continued on next page.)

FOREIGN PATENT DOCUMENTS

| DE | 2847267 C2 | 5/1980 |
| DE | 2847267 | * 5/1980 |
| EP | 831 136 | 3/1998 |
| GB | 1198312 | 8/1970 |
| JP | 49-109223 | 10/1974 |
| JP | 8-837080 | 3/1995 |
| WO | WO 96/16436 | 5/1996 |

OTHER PUBLICATIONS

Carpio et al., *Journal: TSF (Thin Solid Films)*, Article: 6449, Initial Study on Copper CMP Slurry Chemistries (1995).
Hirabayashi et al., Feb. 22–23, 1996 *CMP–MIC Conference—96SMIC–100P*, pp. 119–123, Chemical Mechanical Polishing of Copper Using a Slurry Composed of Glycine and Hydrogen Peroxide (1996).

*Primary Examiner*—George Goudreau

(57) ABSTRACT

A chemical mechanical polishing slurry comprising a film forming agent, an oxidizer, a complexing agent and an abrasive, and a method for using the chemical mechanical polishing slurry to remove copper alloy, titanium, and titanium nitride containing layers from a substrate.

21 Claims, 3 Drawing Sheets

U.S. PATENT DOCUMENTS

| | | | |
|---|---|---|---|
| 4,910,155 A | 3/1990 | Cote et al. | |
| 4,944,836 A | 7/1990 | Beyer et al. | |
| 4,954,459 A | 9/1990 | Avanzino et al. | |
| 4,956,313 A | 9/1990 | Cote et al. | |
| 5,137,544 A | 8/1992 | Medellin | |
| 5,157,876 A | 10/1992 | Medellin | |
| 5,209,816 A | 5/1993 | Yu et al. | |
| 5,340,370 A | 8/1994 | Cadien et al. | |
| 5,354,490 A | 10/1994 | Yu et al. | |
| 5,391,258 A | 2/1995 | Brancaleoni et al. | |
| 5,407,526 A | 4/1995 | Danielson et al. | |
| 5,476,606 A | 12/1995 | Brancaleoni et al. | |
| 5,478,435 A | * 12/1995 | Murphy et al. | 156/636.1 |
| 5,527,423 A | 6/1996 | Neville et al. | |
| 5,575,837 A | 11/1996 | Kodama et al. | |
| 5,770,095 A | * 6/1998 | Sasaki et al. | 216/38 |
| 5,954,997 A | 9/1999 | Kaufman et al. | |
| 6,063,306 A | * 5/2000 | Kaufman et al. | 252/79.4 |
| 6,126,853 A | 10/2000 | Kaufman et al. | |
| 6,362,106 B1 | * 3/2002 | Kaufman et al. | 438/692 |
| 2001/0041507 A1 | * 11/2001 | Kaufman et al. | 451/36 |

OTHER PUBLICATIONS

Luo et al., Feb. 22–23, 1996 *CMP–MIC Conference—96SMIC–100P*, pp. 145–151, Chemical Mechanical Polishing of Copper in Acid Media (1996).

Steigerwald et al., *J. Electrochem. Soc.*, vol. 142, No. 7, pp. 2379–2385, Electrochemical Potential Measurements During the Chemical Mechanical Polishing Copper Thin Films (1995).

Steigerwald et al., *Materials Chemistry and Physics*, "Chemical Processes in the Chemical Mechanical Polishing of Copper", 41:217–228 (1995).

* cited by examiner

CHEMICAL MECHANICAL POLISHING METHOD USEFUL FOR COPPER SUBSTRATES

This application is a divisional application of U.S. patent application Ser. No. 08/763,705, filed on Dec. 9, 1996, now U.S. Pat. No. 5,954,997.

BACKGROUND OF THE INVENTION (1) Field of the Invention

This invention concerns a chemical mechanical polishing slurry including a complexing agent, at least one oxidizer, at least one abrasive, and a film forming agent. The chemical mechanical polishing slurry is useful for polishing metal layers and thin-films associated with semiconductor manufacturing. More particularly this invention concerns a chemical mechanical polishing slurry that is especially adapted for polishing multiple metal layers and thin-films where one of the layers or films is comprised of copper or a copper containing alloy.

(2) Description of the Art

Integrated circuits are made up of millions of active devices formed in or on a silicon substrate. The active devices, which are initially isolated from one another, are interconnected to form functional circuits and components. The devices are interconnected through the use of well-known multilevel interconnections. Interconnection structures normally have a first layer of metallization, an interconnection layer, a second level of metallization, and sometimes a third and subsequent level of metallization. Interlevel dielectrics such as doped and undoped silicon dioxide ($SiO_2$), are used to electrically isolate the different levels of metallization in a silicon substrate or well. The electrical connections between different interconnection levels are made through the use of metallized vias. U.S. Pat. No. 4,789,648, which is incorporated herein by reference, describes a method for preparing multiple metallized layers and metallized vias in insulator films. In a similar manner, metal contacts are used to form electrical connections between interconnection levels and devices formed in a well. The metal vias and contacts may be filled with various metals and alloys including titanium (Ti), titanium nitride (TiN), tantalum (Ta), aluminum copper (Al—Cu), aluminum silicon (Al—Si), copper (Cu), tungsten (W), and combinations thereof. The metal vias and contacts generally employ an adhesion layer such as titanium nitride (TiN) and/or titanium (Ti) to adhere the metal layer to the $SiO_2$ substrate. At the contact level, the adhesion layer acts as a diffusion barrier to prevent the filled metal and $SiO_2$ from reacting.

In one semiconductor manufacturing process, metallized vias or contacts are formed by a blanket metal deposition followed by a chemical mechanical polish (CMP) step. In a typical process, via holes are etched through an interlevel dielectric (ILD) to interconnection lines or to a semiconductor substrate. Next, a thin adhesion layer such as titanium nitride and/or titanium is generally formed over the ILD and is directed into the etched via hole. Then, a metal film is blanket deposited over the adhesion layer and into the via hole. Deposition is continued until the via hole is filled with the blanket deposited metal. Finally, the excess metal is removed by chemical mechanical polishing, (CMP) to form metal vias. Processes for manufacturing and/or CMP of vias are disclosed in U.S. Pat. Nos. 4,671,851, 4,910,155 and 4,944,836.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry" is applied to the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed. The slurry composition is an important factor in the CMP step. Depending on the choice of the oxidizing agent, the abrasive, and other useful additives, the polishing slurry can be tailored to provide effective polishing to metal layers at desired polishing rates while minimizing surface imperfections, defects and corrosion and erosion. Furthermore, the polishing slurry may be used to provide controlled polishing selectivities to other thin-film materials used in current integrated circuit technology such as titanium, titanium nitride and the like.

Typically CMP polishing slurries contain an abrasive material, such as silica or alumina, suspended in an oxidizing, aqueous medium. For example, U.S. Pat. No. 5,244,523 to Yu et al. reports a slurry containing alumina, hydrogen peroxide, and either potassium or ammonium hydroxide that is useful to remove tungsten at predictable rates with little removal of the underlying insulating layer. U.S. Pat. No. 5,209,816 to Yu et al. discloses a slurry comprising perchloric acid, hydrogen peroxide and a solid abrasive material in an aqueous medium that is useful for polishing aluminum. U.S. Pat. No. 5,340,370 to Cadien and Feller discloses a tungsten polishing slurry comprising approximately 0.1M potassium ferricyanide, approximately 5 weight percent silica and potassium acetate. Acetic acid is added to buffer the pH at approximately 3.5.

U.S. Pat. No. 4,789,648 to Beyer et al. discloses a slurry formulation using alumina abrasives in conjunction with sulfuric, nitric, and acetic acids and deionized water. U.S. Pat. Nos. 5,391,258 and 5,476,606 disclose slurries for polishing a composite of metal and silica which includes an aqueous medium, abrasive particles and an anion which controls the rate of silica removal. Other polishing slurries for use in CMP applications are described in U.S. Pat. No. 5,527,423 to Neville et al., U.S. Pat. No. 5,354,490 to Yu et al., U.S. Pat. No. 5,340,370 to Cadien et al., U.S. Pat. No. 5,209,816 to Yu et al., U.S. Pat. No. 5,157,876 to Medellin, U.S. Pat. No. 5,137,544 to Medellin, and U.S. Pat. No. 4,956,313 to Cote et al.

There are various mechanisms disclosed in the prior art by which metal surfaces can be polished with slurries. The metal surface may be polished using a slurry in which a surface film is not formed in which case the process proceeds by mechanical removal of metal particles and their dissolution in the slurry. In such a mechanism, the chemical dissolution rate should be slow in order to avoid wet etching. A more preferred mechanism is, however, one where a thin abradable layer is continuously formed by reaction between the metal surface and one or more components in the slurry such as a complexing agent and/or a film forming layer. The thin abradable layer is then removed in a controlled manner by mechanical action. Once the mechanical polishing process has stopped a thin passive film remains on the surface and controls the wet etching process. Controlling the chemical mechanical polishing process is much easier when a CMP slurry polishes using this mechanism.

Efforts to develop copper CMP slurries are disclosed in the literature. The RPI effort (J. M. Steigerwald et al, Electrochemical Potential Measurements during the Chemical-Mechanical Polishing of Copper Thin Films, Mat. Res. Soc. Symp. 337, 133 (1994)) is focused on the use of ammonium compounds (ammonium nitrate, chloride, hydroxide), nitric acid, and alumina abrasive. Copper dissolution of 2 nm/min (as measured electrochemically) is assumed to proceed from a film-free surface. Polishing rates, however, are reported to be in excess of 400 nm/min. The discrepancy is explained by importance given to the mechanical action, forming Cu debris, which is then dissolved by solution. Selectivity factors are not given.

Q. Luo et al, *Chemical-Mechanical Polishing of Copper in Acidic Media*, Proceedings—First International Chemical-Mechanical Polish (CMP) for VLSI/LSI Multilevel Interconnection Conference (CMP-MIC), Santa Barbara, February 22–23, (1996) discloses using a CMP slurry including a very aggressive etchant, Fe-nitrate, pH 1–2, in combination with an inhibitor (benzotriazole), a slurry stabilizing surfactant (poly-ethylene-glycol) and alumina. The chemical reaction is apparently controlled by a formation of a corrosion inhibiting film, namely Cu-BTA, with surfactant undermining its protectiveness. Selectivity to oxide is given as 15:1 to 45:1.

CMP electrochemical work at Sematech laboratories is disclosed in R. Carpio et al, *Initial Study On Copper CMP Slurry Chemistries*, Thin Solid Films, 262 (1995). The reference explores the use of electrochemistry in the fundamental characterization of plausible slurries. In addition to several others, potassium permanganate is used as a slurry oxidizer.

H. Hirabayashi et al, *Chemical Mechanical Polishing of Copper Using A Slurry Composed of Glycine and Hydrogen Peroxide*, Proceedings—First International Chemical-Mechanical Polish (CMP) for VLSI/LSI Multilevel Interconnection Conference (CMP-MIC), Santa Barbara, February 22–23, (1996), and Japanese Kokai Patent Application No. 8 (1996) 83780 disclose a mixture of glycine, hydrogen peroxide and silica, with or without benzotriazole, for the CMP process of Cu with a low corrosion rate and defect level. The references disclose that CMP slurries incorporating a chemical agent, such as benzotriazole and n-benzoyl-n-phenylhydroxylamine form a protective film on copper. The removal rate varies, depending on the concentration of slurry components. An optimized rate of 120 nm/min was reported, with TiN rate of 30 nm/min and dishing of 200 nm across the 15 $\mu$m wide structures.

Several relevant Cu chemistries have been discussed in the open literature, each failing to deliver a process which successfully addresses all of the key requirements of a chemical-mechanical polishing slurry; namely metal removal rate of more than 200 nm/min, rate selectivity to metal liners of <5, selectivity to dielectric oxide layer of >50 and overall defect depth of <10%.

Despite the desirability of using a film forming mechanism in a CMP process there remains problems with formulating CMP slurries that can control the thickness of the layer of film formed as well as problems ensuring that the film formed is abradable. These problems can result in a CMP slurry that exhibits unacceptably low polishing rates or poor polishing results. Thus, a need remains for a CMP slurry that is capable of forming a removable thin abradable layer on a substrate surface and more particularly on the surface of a copper alloy containing substrate. A desireable CMP slurry will exhibit good thin film polishing selectivities and simultaneously give polished substrates with minimal dishing and low defectivity.

SUMMARY OF THE INVENTION

The present invention is directed to a chemical mechanical polishing slurry that is able to polish metal containing substrates at acceptable rates.

In addition, the chemical mechanical polishing slurry has a low insulator polishing selectivity while exhibiting high polishing selectivities towards copper and copper alloy containing metal layers.

Furthermore, this invention is directed to methods for using a single chemical mechanical polishing slurry to polish metal layers and particularly copper or copper alloy containing layers in an integrated circuit.

In one embodiment, this invention is a chemical mechanical polishing slurry. The CMP slurry includes an abrasive, an oxidizer, a complexing agent, and a film forming agent. In a preferred embodiment the CMP slurry includes from about 1.0 to about 15.0 weight percent of an alumina abrasive, from about 0.3 to about 12.0 weight percent hydrogen peroxide, from about 1.0 to about 3.0 weight percent ammonium oxalate, and from about 0.01 to about 0.2 weight percent benzotriazole. In another preferred embodiment the CMP slurry includes 1.0 to about 15.0 wt % alumina abrasive, from about 1.0 to 10.0 wt % urea peroxide, from 1.0 to 3.0 wt % ammonium oxalate and from about 0.01 to about 0.2 wt % benzotriazole. All CMP slurry embodiments include deionized water as well.

In another embodiment, this invention is a method for polishing a substrate including at least one metal layer. The method begins by mixing from about 1.0 to about 15.0 weight percent of an abrasive, from about 0.3 to about 12.0 weight percent of an oxidizer, from about 0.5 to about 3.0 weight percent of at least one complexing agent, from about 0.01 to about 0.2 weight percent of at least one film forming agent, and deionized water to give a chemical mechanical polishing slurry. Next, the chemical mechanical polishing slurry is applied to the substrate. Finally, at least a portion of the metal layer is removed from the substrate by bringing a pad into contact with the substrate and moving the pad in relation to the substrate.

DESCRIPTION OF THE CURRENT EMBODIMENT

Figure 1:
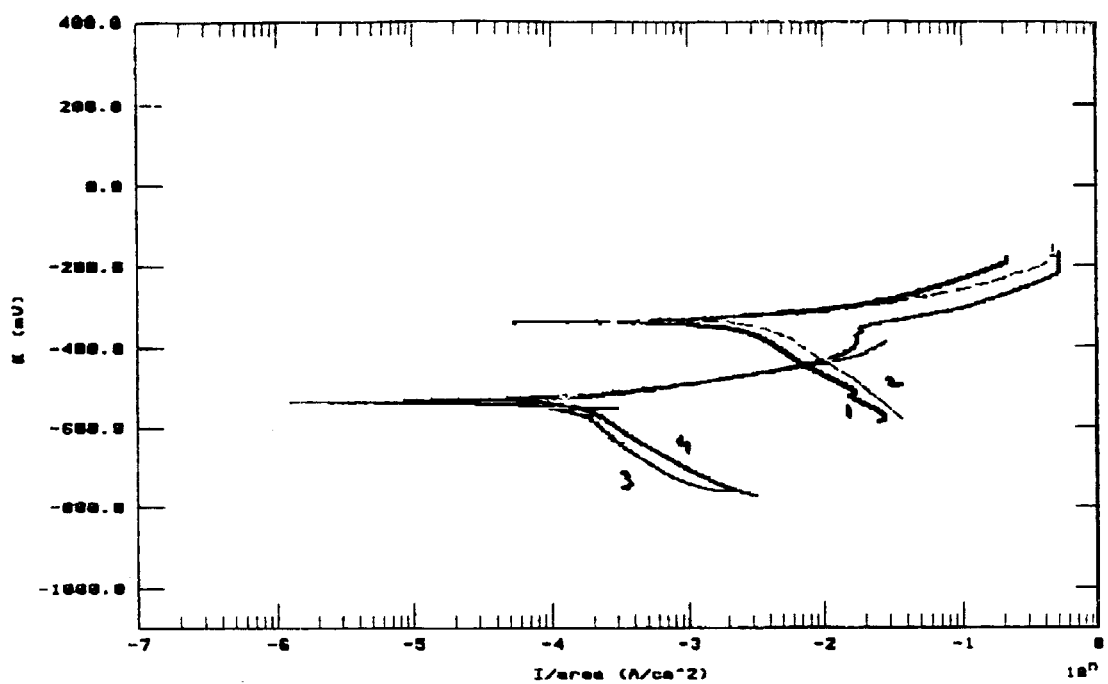
FIG. 1 shows potentiodynamic polarization curves measured on copper in solutions containing 4 weight % of ammonium persulfate and either 1 weight % glycine (curves 1 & 2) or 1 weight % ammonium oxalate (curves 3 & 4). Each set of curves was measured during copper surface abrasion (curves 1 & 3), and again after abrasion had ceased (curves 2 & 4).

The present invention relates to a chemical mechanical polishing slurry that comprises an abrasive, at least one oxidizer, a complexing agent and a film forming agent. The chemical mechanical polishing slurry is especially useful for polishing copper and copper alloy containing metal layers associated with a substrate selected from the group including integrated circuits, thin films, multiple level semiconductors, and wafers.

Before describing the details of the various preferred embodiments of this invention, some of the terms that are used herein will be defined. The chemical mechanical polishing slurry, ("CMP slurry"), is a useful product of this invention that comprises an oxidizer, an abrasive, a complexing agent, a film forming agent, and other optional ingredients. The CMP slurry is useful for polishing a multiple level metallization which may include but are not limited to semi-conductor thin-films, integrated circuit thin-films, and for any other films and surfaces where CMP processes are useful. The terms "copper" and "copper containing alloys" are used interchangeably herein as it is within the understanding of one of skill in the art that the terms include but are not limited to substrates comprising layers of pure copper, copper aluminum alloys, and Ti/TiN/Cu, and Ta/TaN/Cu multi-layer substrates.

The CMP slurry of this invention includes at least one oxidizer. The oxidizer aids in oxidizing the substrate metal layer or layers to their corresponding oxide, hydroxide, or ions. For example, in the present invention, the oxidizer may be used to oxidize a metal layer to its corresponding oxide or hydroxide, e.g., titanium to titanium oxide, tungsten to tungsten oxide, copper to copper oxide, and aluminum to aluminum oxide. The oxidizing agent is useful when incorporated into a CMP slurry to polish metals and metal based components including titanium, titanium nitride, tantalum, copper, tungsten, aluminum, and aluminum alloys such as aluminum/copper alloys, and various mixtures and combinations thereof by mechanically polishing the metals to remove the respective oxide layer.

The oxidizer used in the CMP slurry of this invention may be selected from compounds which, upon reduction, form hydroxyl radicals. Such oxidizers exhibit good polishing selectivity towards metal and metal containing substrate layers and particularly towards copper alloy layers. Non-exclusive examples of metal oxidizing compounds that, upon reduction, form hydroxyl radicals include peracetic acid, urea-hydrogen peroxide and hydrogen peroxide and mixtures thereof, with hydrogen peroxide being a preferred oxidizer. The oxidizer may be present in the chemical mechanical polishing slurry in an amount ranging from about 0.3 to about 20.0 weight percent. It is preferred that the oxidizer is present in the CMP slurry of this invention in an amount ranging from about 0.3 to about 15.0 weight percent and most preferably from about 1.0 to about 12.0 weight percent.

The CMP slurry of this invention also includes a film forming agent. The film forming agent may be any compound or mixtures of compounds that are capable of facilitating the formation of a passivation layer of metal oxides and dissolution inhibiting layers on the surface of the metal layer. Passivation of the substrate surface layer is important to prevent wet etching of the substrate surface. Useful film forming agents are cyclic compounds such as imidazole, benzotriazole, benzimidazole and benzothiazole and their derivatives with hydroxy, amino, imino, carboxy, mercapto, nitro and alkyl substituted groups, as well as urea, thiourea and others. A preferred film forming agent is benzotriazole ("BTA"). The film forming agent should be present in the chemical mechanical polishing slurry of this invention in an amount that is capable of promoting quick, and preferably almost instantaneous formation of passivating layers and dissolution inhibiting layers on the substrate surface. The film forming agent should be present in the CMP slurry of this invention in an amount ranging from about 0.01 weight percent to about 1.0 weight percent. It is preferred that film forming agent is present in the CMP slurry in an amount ranging from about 0.01 to about 0.2 weight percent.

Once a passivation layer has formed on the substrate surface it becomes important to be able to disturb the passivation layer in order to abrade metal oxides from the substrate surface with the abrasive component of the CMP slurry of this invention. One class of compounds that is useful in disturbing the passivation layer are complexing agents. Useful complexing agents include but are not limited to acids such as citric, lactic, tartaric, succinic, acetic, oxalic and other acids, as well as amino acid and amino sulfuric acids and their salts. A preferred complexing agent is ammonium oxalate.

The complexing agents serve at least two useful functions in the CMP slurry of this invention. The complexing agent disturbs the passivation layer during the mechanical abrasion step without destroying the layer or inhibiting its formation during the abrasion step and especially after the abrasion step is complete. Secondly, the complexing agent is believed to form a complex with the oxidized metal and not the underlying unoxidized metal thereby limiting the depth of the oxidized layer. The complexing agent will be present in the CMP slurry of this invention in an amount ranging from about 0.5 to about 5.0 weight present and preferably in an amount ranging from about 1.0 to about 3.0 weight percent.

Other well known polishing slurry additives may be incorporated into the chemical mechanical polishing slurry of this invention. One class of optional additives are inorganic acids and/or salts thereof which may be added to the polishing slurry to further improve or enhance the polishing rate of the barrier layers in the wafer, such as titanium and tantalum. Useful inorganic additives include sulfuric acid, phosphoric acid, nitric acid, HF acid, ammonium fluoride, ammonium salts, potassium salts, sodium salts or other cationic salts of sulfates, phosphates and fluorides.

BTA, or other film forming agents in the CMP slurry of this invention may destabilize the uniform dispersion of abrasive in the slurry. In order to promote stabilization of a CMP slurry of this invention against settling, flocculation, and decomposition, a variety of optional CMP slurry additives, such as surfactants, stabilizers, or dispersing agents, can be used. If a surfactant is added to the CMP slurry, then it may be an anionic, cationic, nonionic, or amphoteric surfactant or a combination of two or more surfactants can be employed. Furthermore, it has been found that the addition of a surfactant may be useful to improve the within-wafer-non-uniformity (WIWNU) of the wafers, thereby improving the surface of the wafer and reducing wafer defects.

In general, the amount of additive such as a surfactant that may be used in the present invention should be sufficient to achieve effective stabilization of the slurry and will typically vary depending on the particular surfactant selected and the nature of the surface of the metal oxide abrasive. For example, if not enough of a selected surfactant is used, it will have little or no effect on CMP slurry stabilization. On the other hand, too much surfactant in the CMP slurry may result in undesirable foaming and/or flocculation in the slurry. As a result, stabilizers such as surfactants should generally be present in a range between about 0.001% and 2% by weight, and preferably from about 0.01 to about 1.0 weight percent. Furthermore, the additive may be added directly to the slurry or treated onto the surface of the metal oxide abrasive utilizing known techniques. In either case, the amount of additive is adjusted to achieve the desired concentration in the polishing slurry. Preferred surfactants include dodecyl sulfate sodium salt, sodium lauryl sulfate, dodecyl sulfate ammonium salt, and mixtures thereof. Examples of useful surfactants include TRITON® DF-16 manufactured by Union Carbide, and SURFYNOL® manufactured by Air Products and Chemicals.

The CMP slurry of this invention includes an abrasive. The abrasive is typically a metal oxide abrasive. The metal oxide abrasive may be selected from the group including alumina, titania, zirconia, germania, silica, ceria and mixtures thereof. The CMP slurry of this invention preferably includes from about 1.0 to about 15.0 weight percent or more of an abrasive. It is more preferred, however, that the CMP slurry of this invention includes from about 3.0 to about 6.0 weight percent abrasive.

The metal oxide abrasive may be produced by any techniques known to those skilled in the art. Metal oxide abrasives can be produced using any high temperature process such as sol-gel, hydrothermal or, plasma process, or by processes for manufacturing fumed or precipitated metal oxides. Preferably, the metal oxide is a fumed or precipitated abrasive and, more preferably it is a fumed abrasive such as fumed silica or fumed alumina. For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art.

A preferred metal oxide will have a surface area, as calculated from the method of S. Brunauer, P. H. Emmet, and I. Teller, J. Am. Chemical Society, Volume 60, Page 309 (1938) and commonly referred to as BET, ranging from about 5 $m^2/g$ to about 430 $m^2/g$ and preferably from about 30 $m^2/g$ to about 170 $m^2/g$. Due to stringent purity requirements in the IC industry the preferred metal oxide should be of a high purity. High purity means that the total impurity content, from sources such as raw material impurities and trace processing contaminants, is typically less than 1% and preferably less than 0.01% (i.e., 100 ppm).

In this preferred embodiment, the metal oxide abrasive consists of metal oxide aggregates having a size distribution less than about 1.0 micron, a mean aggregate diameter less than about 0.4 micron and a force sufficient to repel and overcome the van der Waals forces between abrasive aggregates themselves. Such metal oxide abrasive has been found to be effective in minimizing or avoiding scratching, pit marks, divots and other surface imperfections during polishing. The aggregate size distribution in the present invention may be determined utilizing known techniques such as transmission electron microscopy (TEM). The mean aggregate diameter refers to the average equivalent spherical diameter when using TEM image analysis, i.e., based on the cross-sectional area of the aggregate. By force is meant that either the surface potential or the hydration force of the metal oxide particles must be sufficient to repel and overcome the van der Waals attractive forces between the particles.

In another preferred embodiment, the metal oxide abrasive may consist of discrete, individual metal oxide particles having a primary particle diameter less than 0.4 micron (400 nm) and a surface area ranging from about 10 $m^2/g$ to about 250 $m^2/g$.

Preferably, the metal oxide abrasive is incorporated into the aqueous medium of the polishing slurry as a concentrated aqueous dispersion of metal oxides, which aqueous dispersion of metal oxide abrasives typically ranges from about 3% to about 45% solids, and preferably between 10% and 20% solids. The aqueous dispersion of metal oxides may be produced utilizing conventional techniques, such as slowly adding the metal oxide abrasive to an appropriate media, for example, deionized water, to form a colloidal dispersion. The dispersion is typically completed by subjecting it to high shear mixing conditions known to those skilled in the art. The pH of the slurry may be adjusted away from the isoelectric point to maximize colloidal stability.

It is desirable to maintain the pH of the CMP slurry of this invention within a range of from about 2.0 to about 12.0, and preferably between from about 4.0 to about 9.0 in order to facilitate control of the CMP process. Slurry handling problems and substrate polishing quality problems are encountered when the pH of the CMP slurry of this invention is too low, e.g., less than 2. The pH of the CMP slurry of this invention may be adjusted using any known acid, base, or amine. However, the use of an acid or base that contains no metal ions, such as ammonium hydroxide and amines, or nitric, phosphoric, sulfuric, or organic acids are preferred to avoid introducing undesirable metal components into the CMP slurry of this invention.

Although the CMP slurry of this invention may be used to polish any type of metal layer, the chemical mechanical polishing slurry of this invention has been found to have a high copper, titanium, titanium nitride, and tantalum nitrate and acceptable tantalum polishing rates. In addition, the chemical mechanical polishing slurry exhibits desirable low polishing rates towards the dielectric insulating layer.

The CMP slurry of this invention may be produced using conventional techniques known to those skilled in the art. Typically, the oxidizing agent and other non-abrasive components, are mixed into an aqueous medium, such as deionized or distilled water, at pre-determined concentrations under low shear conditions until such components are completely dissolved in the medium. A concentrated dispersion of the metal oxide abrasive, such as fumed alumina, is added to the medium and diluted to the desired loading level of abrasive in the final CMP slurry.

The CMP slurries of the present invention may be supplied as one package system (oxidizing agent, abrasive, film forming agent and passivating agent in a stable aqueous medium). To avoid possible CMP slurry degradation, however, it is preferred that at least a two package system is used where the first package comprises the film forming agent and any optional additives, and the second package comprises the aqueous abrasive dispersion and an oxidizer. The remaining component, the complexing agent, may be placed in either the first container, the second container or in a third container. Other two-container combinations of the ingredients of the CMP slurry of this invention are within the knowledge of one having ordinary skill in the art.

A multi-package CMP slurry system may be used with any standard polishing equipment appropriate for use on the desired metal layer of the wafer. The multi-package system includes one or more CMP slurry components in, where appropriate, aqueous or dry form in two or more containers. The multi-package system is used by combining the components from the various containers in the desired amounts to give a CMP slurry comprising at least one oxidizing agent, a film forming agent, a complexing agent and at least one abrasive in the amounts described above.

The CMP slurry of the present invention does not significantly increase the silicon dioxide polishing rate. However, the CMP slurry of this invention polishes copper, titanium, titanium nitride, tantalum, and tantalum nitride layers at good rates under controllable conditions. Thus, the CMP slurry of this invention is effective in controlling polishing selectivities of titanium, copper, and titanium nitride. The polishing slurry of the present invention may be used during the various stages of semiconductor integrated circuit manufacture to provide effective polishing at desired polishing rates while minimizing surface imperfections and defects.

EXAMPLES

We have discovered that a CMP slurry including at least one oxidizer, a complexing agent and a film forming agent is capable of polishing multiple metal layers comprising copper alloys, titanium, and titanium nitride at high rates while exhibiting an acceptable low polishing rate towards dielectric layers.

The following examples illustrate preferred embodiments of this invention as well as preferred methods for using compositions of this invention.

Example 1

Electrochemical tests are used to evaluate CMP mechanisms and to provide guidance in selection of slurry components. The electrochemical cell used was developed in the IBM Laboratories and is described in V. Brusic et al., *Corrosion And Inhibition Of Thin Line Conductors In VLSI Structures*, IBM J R&D, 37, 173 (1993), incorporated herein by reference. The electrochemical cell allows for the evaluation of the electrode potential and the metal dissolution rate of a substrate, with and without surface abrasion. The method uses a PAR model 273 potentiostar with PAR corrosion software.

FIG. 1 illustrates processes governing the dissolution of copper in the presence of an oxidizer, i.e., 4 weight % ammonium persulfate with either glycine (1 & 2) or ammonium oxalate (3 & 4), both present in the amount of one percent by weight at pH 5.1. In both cases the anodic Tafel slope is quite low, and the difference between the potentiodynamic polarization curves with and without abrasion is very small. The electrochemical cell results indicate that the Cu surface is not covered by an oxide film. However, copper dissolution is at least twenty times slower in the presence of ammonium oxalate. In a comparison to glycine, oxalate is a more effective inhibitor to copper dissolution. There is also a persistent difference in the corrosion potentials, with the potential in the ammonium oxalate being consistently lower than the potential measured in glycine, indicating that a preferential dissolution process would lead to $Cu^+$ ions while with glycine, $Cu^{++}$ ion formation is possible.

Figure 2:
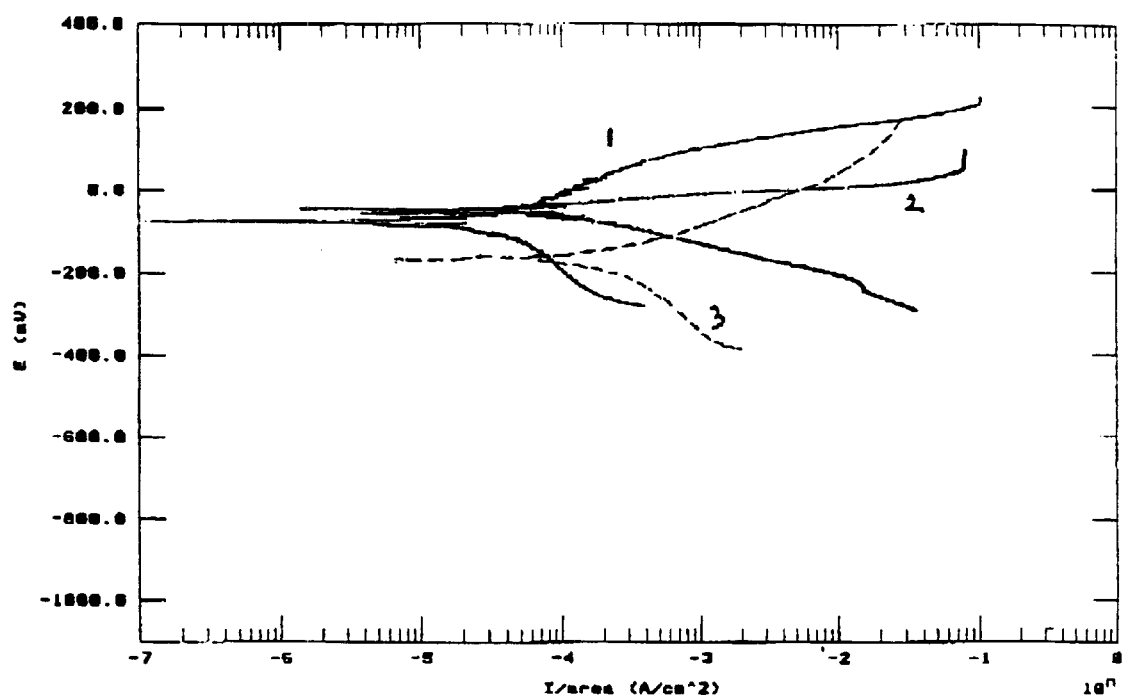
FIG. 2 shows potentiodynamic polarization curves on copper in: 11% $H_2O_2$ wt % oxidizer solution (curve 1 after abrasion); in electrolyte with the same oxidizer and 1 wt % glycine (curve 2, after abrasion); and in the same oxidizer with 1 wt % ammonium oxalate (curve 3, also after abrasion).

At higher pHs, oxalate still adsorbs at the copper surface, but ammonium oxalate also acts to increase the copper dissolution rate through formation of $Cu(NH_3)_x^+$ and $Cu(NH_3)_x^{++}$ complexes. FIG. 2 shows the dissolution and passivation of copper in 11% $H_2O_2$ (curve 1, after surface abrasion), the same oxidizer with 1 weight % glycine (curve 2) and the same oxidizer with 1% ammonium oxalate (curve 3). Corrosion potential is lowest in the presence of ammonium oxalate. Although in ammonium oxalate the copper dissolution is enhanced in a comparison to peroxide alone, reaching about 200 nm/min during abrasion, the surface repassivation does occur, leading to the dissolution rate after abrasion of only 5.5 nm/min. The additions of small amounts of BTA assure that the passivation should occur promptly, with Cu-BTA providing an additional factor in copper dissolution control. In contrast, copper dissolution in glycine is the same with and without abrasion, reaching the uncontrollable values of over 300 nm/min without surface repassivation.

Example 2

Cu and Ti wafers were polished with a CMP slurry using a Strasbaugh polisher at 3 psi down force, 45 rpm table speed, and 50 rpm spindle speed. The CMP slurry was formulated to vary the concentration of hydrogen peroxide, ammonium oxalate, benzotriazole and wetting agent as shown in Table 1A. Cu and Ti removal rates were measured. Several rates for prior art slurries including hydrogen peroxide and glycine were also determined and reported in Table 1B. All slurries contained alumina abrasive, with 5% solids. The wetting agent used was Triton DF16 manufactured by Union Carbide Chemicals & Plastics Co., Danbury, Conn.

TABLE 1A

Polishing rates of Cu and Ti in peroxide slurries

| Peroxide ($H_2O_2$) | Ammonium Oxalate | BTA | Wetting Agent | Cu Rate nm/min | Ti Rate nm/min |
|---|---|---|---|---|---|
| 7% | 0% | 0 | 50 ppm | 21.7 | 80.6 |
| 7% | 0.5% | 0 | 50 ppm | 278 | 30.7 |
| 11% | 0.5% | 0 | 10 ppm | 251.7 | 25.4 |
| 11% | 1.0% | 0 | 10 ppm | 402.9 | 80.4 |
| 9% | 1.0% | 0.04% | 30 ppm | 170.7 | 94.1 |
| 7% | 1.5% | 0.08% | 10 ppm | 304.7 | 108.6 |

TABLE 1B

| Peroxide ($H_2O_2$) | Glycine | BTA | Wetting Agent | Cu Rate nm/min | Ti Rate nm/min |
|---|---|---|---|---|---|
| 11% | 0.1% | 0 | 0 | 52.8 | 101.4 |
| 8% | 1.1% | 0 | 25 ppm | 493.7 | 75.6 |
| 11% | 2.1% | 0 | 0 | 778.3 | 53.4 |

The results of the CMP polishing tests set forth in Tables 1A and 1B show that CMP slurries of this invention are capable of achieving preferred copper and titanium polishing rates and selectivities including a Cu rate of at least 100 nm/min and a [Cu:Ti] selectivity of at most 4:1.

Example 3

The reproducability of Cu removal rates and within wafer non-uniformity (WIWNU) results for a CMP slurry containing 11.0 weight hydrogen peroxide, 1.5% ammonium oxalate, 0.04% BTA, 50 ppm of TRITON® DF-16 surfactant manufactured by Union Carbide, and 5% alumina abrasive was evaluated in this Example. The CMP slurry was applied successively to copper wafers on a Strasbaugh polisher, using 31158 buffed pad with DF 200 insert, a 4 psi down force, a table speed of 50 rpm, and a spindle speed of 50 rpm.

Figure 3:
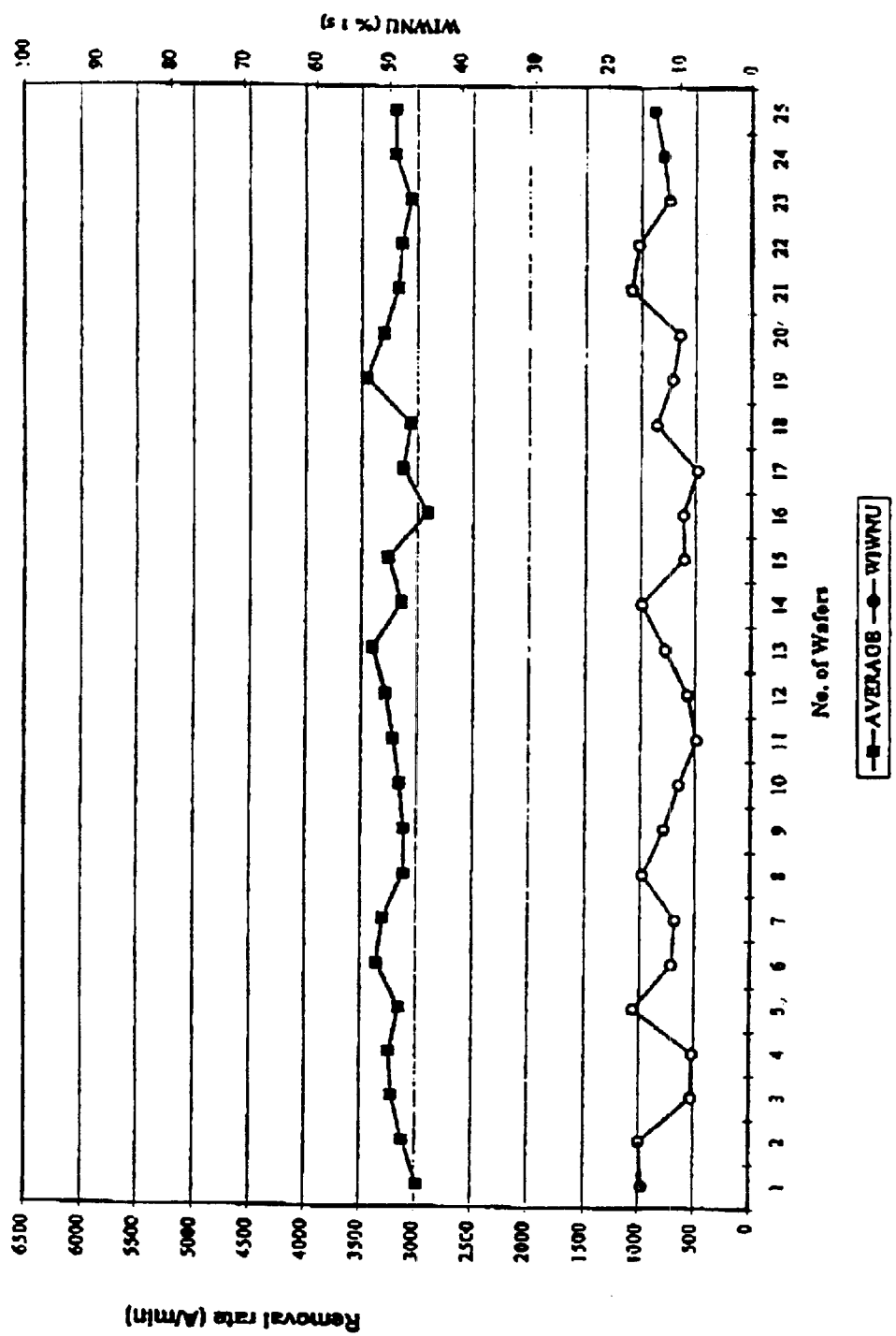
FIG. 3 shows the reproducibility of the polishing performance, i.e., polishing rate and within wafer non-uniformity, for copper using a CMP slurry of this invention comprising 5.0 wt % alumina abrasive, 11.0 wt % $H_2O_2$, 1.5 wt % ammonium oxalate, 0.04 wt % benzotriazole, and 50 ppm wetting agent (TRITON® DF-16).

The experimental results, plotted in FIG. 3 demonstrate that the slurry polishing performance is quite uniform and does not degrade over time.

What we claim is:

1. A method for polishing a substrate including at least one metal layer comprising the steps of:
   (a) admixing, an abrasive, from about 0.3 to about 15.0 weight percent of an oxidizer, from 1.0 to about 3.0 weight percent of at least one complexing agent, from 0.08 to about 1.0 weight percent of at least one film forming agent and deionized water to give a chemical mechanical polishing slurry;
   (b) applying the chemical mechanical polishing slurry to the substrate; and
   (c) removing at least a portion of the metal layer from the substrate by bringing a pad into contact with the substrate and moving the pad in relation to the substrate.

2. The method of claim 1 wherein the substrate includes a copper alloy containing layer.

3. The method of claim 1 wherein the pH is about 4 to about 9.0.

4. The method of claim 1 wherein the at least one complexing agent is selected from the group consisting of citric acid, lactic acid, tartaric acid, succinic acid, oxalic acid, and salts thereof.

5. The method of claim 4 wherein the oxidizer is hydrogen peroxide, urea hydrogen peroxide and mixtures thereof and the pH is about 4 to about 9.0.

6. The method of claim 1 wherein the oxidizer is hydrogen peroxide, urea hydrogen peroxide and mixtures thereof.

7. The method of claim 1 wherein the metal oxide abrasive is selected from the group consisting of precipitated alumina, fumed alumina, precipitated silica, fumed silica, and mixtures thereof.

8. The method of claim 1 wherein the chemical mechanical polishing slurry is supplied as a first container comprising the film forming agent and the complexing agent, and a second container comprising the oxidizing agent, and wherein the abrasive is located in a container selected from the group consisting of the first container, the second container, and a third container.

9. A method for polishing a substrate including at least one metal layer comprising the steps of:
   (a) admixing, an abrasive, from about 0.3 to about 15.0 weight percent of an oxidizer, from 1.0 to about 3.0 weight percent of at least one complexing agent selected from the group consisting of citric acid, lactic acid, tartaric acid, succinic acid, oxalic acid, amino acid, and salts thereof, from 0.08 to about 1.0 weight percent of at least one film forming agent and deionized water to give a chemical mechanical polishing slurry;
   (b) applying the chemical mechanical polishing slurry to the substrate; and
   (c) removing at least a portion of the metal layer from the substrate by bringing a pad into contact with the substrate and moving the pad in relation to the substrate.

10. The method of claim 9 wherein the chemical mechanical polishing slurry is applied to the pad before the pad is placed into contact with the substrate.

11. The method of claim 9 wherein the oxidizer is hydrogen peroxide, urea hydrogen peroxide and mixtures thereof.

12. The method of claim 9 wherein the complexing agent is selected from the group consisting of citric acid, lactic acid, tartaric acid, succinic acid, oxalic acid, and salts thereof.

13. The method of claim 9 wherein the film forming agent is benzotriazole.

14. The method of claim 9 wherein the abrasive is a metal oxide.

15. The method of claim 14 wherein the metal oxide abrasive is selected from the group consisting of alumina, ceria, germania, silica, titania, zirconia, and mixtures thereof.

16. The method of claim 9 wherein the abrasive is an aqueous dispersion of a metal oxide.

17. The method of claim 16 wherein the metal oxide abrasive is selected from the group consisting of precipitated alumina, fumed alumina, precipitated silica, fumed silica, and mixtures thereof.

18. The method of claim 9 wherein the chemical mechanical polishing slurry further comprises a compound selected from the group consisting of ammonium hydroxide, an ammonium salt, and mixtures thereof.

19. The method of claim 9 wherein the substrate comprises a copper alloy, a titanium layer and titanium nitride layer, and wherein the copper alloy to titanium polishing selectivity (Cu:Ti) is less than about 4.

20. The method of claim 9 wherein the substrate includes a copper alloy containing layer.

21. The method of claim 9 wherein the substrate further includes a titanium and titanium nitride layer wherein at least a portion of the titanium and titanium nitride layer is removed in step (c).

* * * * *